United States Patent [19]

Shinbach et al.

[11] Patent Number: 5,032,209
[45] Date of Patent: Jul. 16, 1991

[54] HEAT SEALING OF SEMICRYSTALLINE QUASI-AMORPHOUS POLYMERS

[75] Inventors: Madeline P. Shinbach; Robert W. Warner; Andrew J. Ouderkirk; Douglas S. Dunn, all of St. Paul, Minn.

[73] Assignee: Minnesota Mining and Manufacturing Company, St. Paul, Minn.

[21] Appl. No.: 187,024

[22] Filed: Apr. 27, 1988

Related U.S. Application Data

[63] Continuation of Ser. No. 26,051, Mar. 16, 1987, abandoned.

[51] Int. Cl.$^5$ .............................................. B32B 31/00
[52] U.S. Cl. ............................. 156/272.6; 156/272.8; 156/273.5; 156/275.3; 156/309.6; 264/22; 264/25
[58] Field of Search ............... 156/272.2, 273.5, 309.6, 156/272.8, 273.7, 275.7, 272.8, 309.9, 308.2, 272.6; 204/157.15, 157.6, 157.61; 264/22, 25; 250/492.1; 427/53.1, 54.1, 55; 428/516; 249/121

[56] References Cited

U.S. PATENT DOCUMENTS

| | | | |
|---|---|---|---|
| 2,876,187 | 3/1959 | Wolinski | 204/158 |
| 3,081,485 | 3/1963 | Steigerwald | 18/1 |
| 3,145,242 | 8/1964 | Bryan | 264/80 |
| 3,607,354 | 9/1971 | Krogh et al. | 117/47 |
| 3,914,521 | 10/1975 | Beatty et al. | 428/461 |
| 3,978,341 | 8/1976 | Hoell | 250/492 |
| 4,048,428 | 9/1977 | Baird et al. | 526/343 |
| 4,247,496 | 1/1981 | Kawakami et al. | 264/22 |
| 4,311,759 | 1/1982 | Glennon | 428/345 |
| 4,414,059 | 11/1983 | Blum et al. | 156/659.1 |
| 4,417,948 | 11/1983 | Mayne-Banton et al. | 156/643 |
| 4,482,204 | 11/1984 | Blyler et al. | 350/96.34 |
| 4,518,654 | 5/1985 | Eichbauer et al. | 428/331 |
| 4,568,632 | 2/1986 | Blum et al. | 430/322 |
| 4,631,155 | 12/1986 | Caines | 264/22 |
| 4,710,563 | 12/1987 | Oetting | 528/501 |

FOREIGN PATENT DOCUMENTS

| | | |
|---|---|---|
| 33792 | 3/1980 | Japan . |
| 82380 | 4/1984 | Japan . |
| 101937 | 5/1984 | Japan . |
| 101938 | 5/1984 | Japan . |
| 760611 | 11/1956 | United Kingdom . |
| 1117354 | 6/1968 | United Kingdom . |
| 1149812 | 4/1969 | United Kingdom . |
| 1579002 | 11/1980 | United Kingdom . |

OTHER PUBLICATIONS

Journal of American Chemical Society, 104, 6784–6785 (1982), Srinivasan & Leig Bishop & Dyer, Applied Physics Letters, 47, 1229 (1985).
Srinivasan & Lazare, Polymer, 26, 1297 (1985) Conference Issue Srinivasan, Journal of the Vacuum Society, B1, 923 (1983).
Day and Wiles, Journal of Applied Polymer Science, 16, 175 (1972).
Blais, Day and Wiles, Journal of Applied Polymer Science, 17, 1895 (1973).
Mimura et al., Japanese Journal of Applied Physics, 17, 541 (1978).
Lazare and Srinivasan, Journal Physical Chemistry, 90, 2124 (1986).
Kawamura et al., Applied Physics Letters, 40, 374 (1982).
Polymer Interface and Adhesion, Souheng Wu, Published by Marcel Dekker, Inc. New York and Basel, Chapter 5, p. 206.

(List continued on next page.)

Primary Examiner—Michael W. Ball
Assistant Examiner—Jeff H. Aftergut
Attorney, Agent, or Firm—Gary L. Griswold; Walter N. Kirn; Mark A. Litman

[57] ABSTRACT

Semicrystalline polymers can have predetermined amounts of their surfaces rendered quasi-amorphous by irradiation. Polymer surfaces which are so modified can display enhanced heat sealability to accept bonding to other materials.

31 Claims, 1 Drawing Sheet

OTHER PUBLICATIONS

Yorkgitis et al., "Polymeric Film with Reduced Surface Friction," U.S. Serial No. 25,884, Filed Mar. 16, 1987.

Ouderkirk et al., "A Process for the Surface Modification of Semicrystalline Polymers," U.S. Serial No. 25,874, Filed Mar. 16, 1987.

Warner et al., "Suface Modification of Semicrystalline Polymers," U.S. Serial No. 25,881, Filed Mar. 16, 1987.

Ouderkirk et al., "Polymer with Reduced Internal Migration," U.S. Serial No. 25,844, Filed Mar. 16, 1987.

Ouderkirk et al., "Surface Modification of Semicrystalline Polymers," U.S. Serial No. 25,845, filed Mar. 16, 1987.

Incremona et al., "Improved Adhesive Bonding to Polymer Surfaces," U.S. Serial No. 25,847, Filed Mar. 16, 1987.

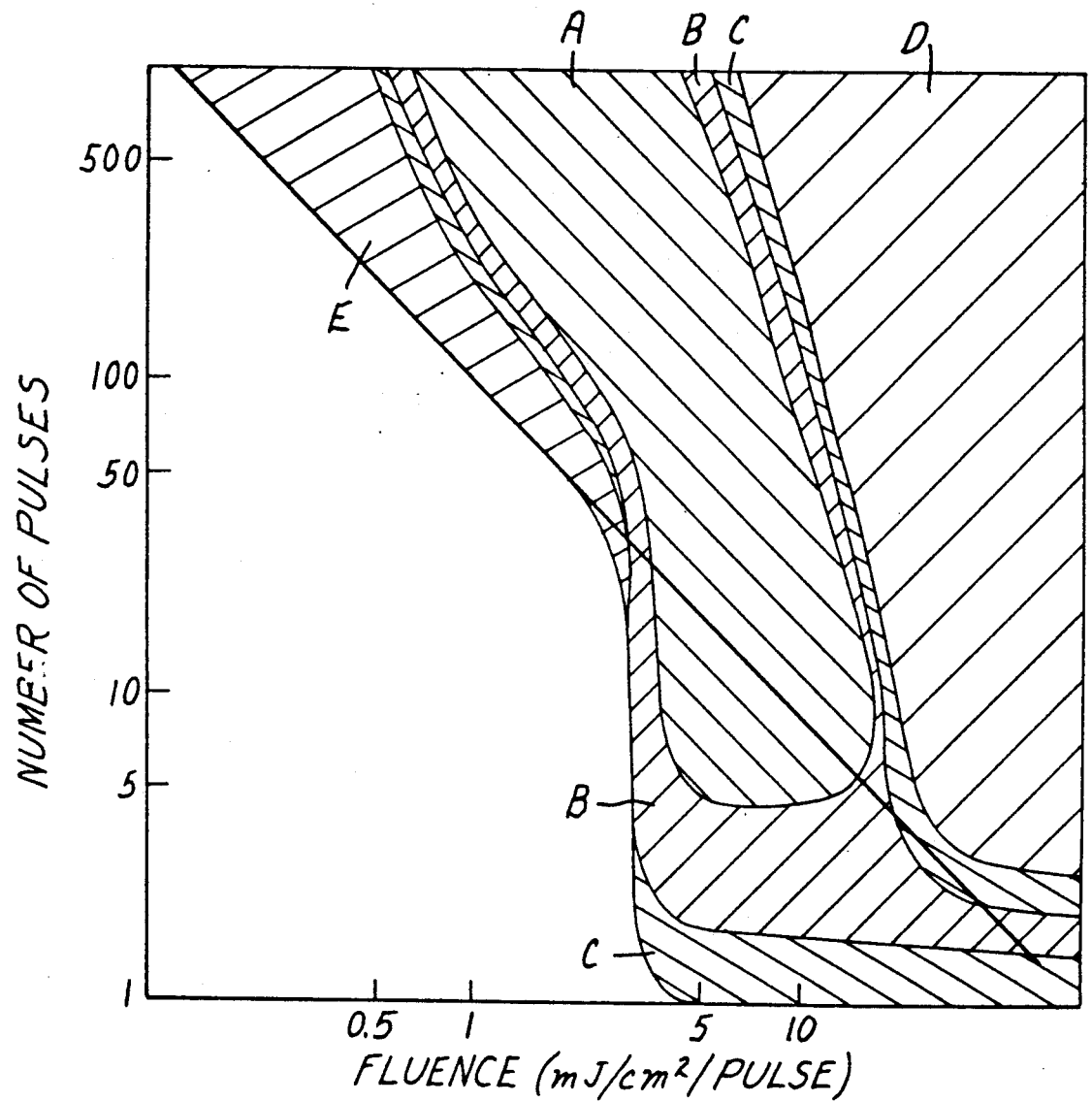

HEAT SEALING OF SEMICRYSTALLINE QUASI-AMORPHOUS POLYMERS

This application is a continuation of Ser. No. 07/026051 filed 3-16-87, now abandoned.

BACKGROUND OF THE INVENTION

1. Field of the Invention

The present invention relates to heat sealable semicrystalline polymeric materials and particularly to heat sealable semicrystalline polymeric materials having a quasi-amorphous surface layer of the same or similar polymeric material.

2. Background of the Art

The effects of actinic radiation on the degradation of polymer surfaces have been studied for many years. Prior to about 1970, this work was done with low intensity photolamps at wavelengths greater than 220 nanometers (nm). Numerous papers are available in the literature, typical of which are Day and Wiles, *Journal of Applied Polymer Science*, 16 175 (1972), and Blais, Day and Wiles, *Journal of Applied Polymer Science*, 17 p. 1895 (1973).

Between 1970 and 1980 the effects on polymer surfaces of ultra-violet (UV) lamps with wavelengths less than 220 nm were studied for lithography and surface modification purposes. Such studies are exemplified by Mimura et al., *Japanese Journal of Applied Physics*, 17 541 (1978). This work illustrates that long exposure times and high energies are required to cause photo-etching when UV lamps are used. U.S. Pat. No. 3,978,341 (Hoell) teaches an apparatus for exposing polymeric contact lenses to a spark discharge producing 83 nm to 133.5 nm U.V. radiation to improve the wettability and adhesiveness of the lenses.

In 1975 the excimer laser was discovered. An excimer laser is an excited dimer laser where two normally non-reactive gases (for example Krypton, Kr, and Fluorine, $F_2$) are exposed to an electrical discharge. One of the gases (Kr) is energized into an excited state (Kr*) in which it can combine with the other gas ($F_2$) to form an excited compound (KrF*). This compound gives off a photon and drops to an unexcited state which, being unstable, immediately disassociates to the orginal gases (Kr and $F_2$) and the process is repeated. The released photon is the laser output. The uniqueness of the excimer laser is its high efficiency in producing short wavelength (UV) light and its short pulse widths. These attributes make the excimer laser useful for industrial applications. Kawamura et al., *Applied Physics Letters*, 40 374 (1982) reported the use of a KrF excimer laser at 248 nm wavelengths to photo-etch polymethyl methacrylate (PMMA), a polymer used in preparing photolithography resists for semiconductor fabrication.

U.S. Pat. No. 4,414,059 (Blum, Brown and Srinivasan) disclosed a technique for the manufacture of microelectronic devices utilizing ablative photodecomposition of lithography resist amorphous polymers at wavelengths less than 220 nm and power densities sufficient to cause polymer chain fragmentation and immediate escape of the fragmented portions. The photodecomposition leaves an etched surface. The authors found that using an ArF excimer laser at 193 nm and with a 12 nanosecond pulse width, a threshold for ablatively photo decomposing poly(methylmethacrylate) resist material occurs at about a fluence of 10–12 $mJ/cm^2$/pulse. It is stated that large amounts of energy, greater than the threshold amount, must be applied before ablation will occur. The energy used must be 1) sufficiently great and 2) applied in a very short amount of time to produce ablative photodecomposition.

U.S. Pat. No 4,417,948 (Mayne-Banton and Srinivasan) and a related publication, Srinivasan and Leigh, *Journal American Chemical Society*, 104 6784 (1982) teach a method of UV photo etching poly(ethylene terephthalate) (PET). In these publications the authors indicate the mechanism of photo etching to be one of chain scission or bond breaking of surface polymer molecules by the high energy UV. Bond breaking continues in the presence of irradiation and the smaller units continue to absorb radiation and break into still smaller units until the end products vaporize and carry away any excess photon energy. This process results in small particles being ablated away, and various gases being evolved. The remaining surface material comprises molecules of low molecular weight (oligomers). Examining the PET repeating unit and the author's claim of bond scission, it is believed that the following occurs:

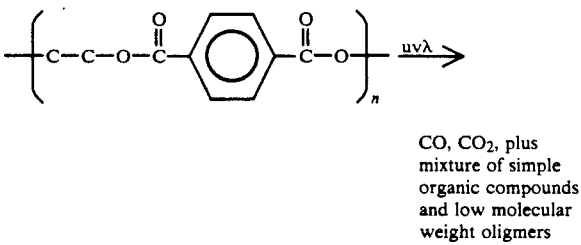

CO, $CO_2$, plus mixture of simple organic compounds and low molecular weight oligmers Indeed, in the *Journal of the American Chemical Society* article, the authors analyze for benzene and start detecting it at about the threshold for photodecomposition for PET; i.e., about 20 $mJ/cm^2$/pulse at 193 nm. The authors also indicate that the photo etch process is accelerated in the presence of oxygen which seals the ends of the broken chain's fragments and prevents recombination of these fragments.

Srinivasan, *Journal of the Vacuum Society*, B1, 923 (1983) reports the results of ablative photodecomposition of organic polymers through a 0.048 cm diameter mask and states that a threshold exists for the onset of ablation and, for PMMA, that the threshold is 10 $mJ/cm^2$/pulse. He then goes on to state that one pulse at 16 $mJ/cm^2$ gave an etch mark on PMMA while 50 pulses at 4 $mJ/cm^2$/pulse left no detectable etch marks. For PET and polyimide, the threshold began at about 30 $mJ/cm^2$/pulse. However, for a satisfactory etch pattern the optimum fluence ranged from 100 to 350 $mJ/cm^2$/pulse.

In Srinivasan and Lazare, *Polymer*, 26, 1297 (1985) Conference Issue, the authors report the photo etching of 6 X 12 mm samples of PET, PMMA and polyimide polymers with both continuous radiation at 185 nm from UV lamps and pulsed radiation at 193 nm from an excimer laser. The use of continuous low energy UV lamps causes photo oxidation of the polymer surface with a resultant increased oxygen to carbon ratio (O/C ratio) as determined by x-ray photoelectron spectroscopy (XPS) equipment, while the use of a pulsed high energy excimer laser, which produces chain scission in and ablation of the polymer surface, resulted in a lower O/C ratio as determined by XPS. The authors then go on to say "It may be pointed out that ablative photo decomposition is not exactly a method for the modification of a polymer surface at an atomic level since it totally eliminates the atoms at the surface and creates a fresh surface."

U.S. Pat. No. 3,607,354 discloses the use of highly active hydroxybenzene solvents to delustre the surface of an oriented poly(ethylene terephthalate) film. The solvent acts to dissolve and swell the PET and remains in the surface layer. The chemical composition of the surface layer is different from that of the bulk polymer because of the presence of the very active solvents and the formation of large spherulitic crystals which interrupt the transmission of light through that layer is believed to occur.

U.S. Pat. No. 4,568,632 (Blum, Holloway and Srinivasan) claims a method for photo etching polyimides. The process described uses a pulsed excimer laser at 193 nm. The stated incident energy required for photo ablation is much higher for polyimide than for PET. The values for the laser fluence threshold of PET was reported as about 30 mJ/cm$^2$/pulse while for polyimide it was reported as about 50 mJ/cm$^2$/pulse. An operative level was noted as about 50–100 mJ/cm$^2$/pulse for PET and 100–300 mJ/cm$^2$/pulse for polyimide. The etch rate found for PET was 1000 Angstroms for a fluence of 100–300 mJ/cm$^2$/pulse and for the polyimide was 750 Angstroms for 350 mJ/cm$^2$/pulse.

Lazare and Srinivasan, *Journal Physical Chemistry*, 90, 2124 (1986) report on the study of surface properties of PET which have been modified by either pulsed UV laser radiation or continuous UV lamp radiation. The authors report on the high fluence ablation of PET as follows: 1) the PET irradiated surface is a layer of low molecular weight material, 2) the surface has a rough chemically homogeneous texture, 3) the surface has a high chemical reactivity characteristic of oligomers, and 4) the surface could be removed by washing in acetone. Since extremely low molecular weight fragments (oligomers) of PET are soluble in acetone, the authors assert this removal of the treated surface is indicative of the presence of low molecular weight material on the surface. The authors also report that the low intensity UV lamp treated PET surfaces would not wash off with acetone. This later article reports thresholds for ablation of PET at about 30–40 mJ/cm$^2$/pulse.

Japanese Patent Publications JA 59-82380, JA 59-101937 and JA 59-101938 (Kitamura, Veno and Nomura) describe the treatment of various polymers with many pulses from moderately high energy lasers for the purpose of increasing adhesion and forming a barrier layer to prevent plasticizer migration from within certain polymers.

Bishop and Dyer, *Applied Physics Letters*, 47, 1229 (1985) extended the photoablation etching work of others to actually cutting through or slitting the polymer film by increasing the energy density of the laser beam by concentrating it at the film surface.

The authors of the above references were studying the photodecomposition or photoablation process of UV radiation on polymer surfaces, without regard to whether the polymer was semi-crystalline or amorphous. The present invention does not produce substantial photodecomposition and little or no photoablation, and is concerned only with semicrystalline polymer surfaces produced by exposure to an energy regime different from those used in the prior art.

"Polymer Interface and Adhesion", Souheng Wu, Published by Marcel Dekker, Inc., N.Y. and Basel, Chapter 5, page 206 indicates that when a polymer melt cools and solidifies, an amorphous surface is usually formed, although its bulk phase may be semicrystalline. This is at least in part a result of the presence of fractions or materials which are not readily accomodated in the crystalline structure being rejected to the surface. This amorphous surface is believed to be extremely thin, corresponding to only a few layers of molecules, and is of the order of no more than 2 or 3 nm, and is generally less than 2 nm in thickness.

U.K. Patent No. 1,579,002 discloses vacuum glow discharge treatment of polymeric surfaces to increase adhesion to that surface. The glow discharge (i.e., corona type discharge) in the vacuum reduces the yellowing typically resulting from corona discharge treatment by 75 to 80%. The surfaces are heated to a temperature below the glass transition temperature or melting point during glow discharge treatment.

U.S. Pat. No. 3,081,485 describes a process for heating and softening polymeric materials using electron-beam irradiation so that further mechanical treatment such as stretching and coating can be carried out. The energy densities used (e.g., column 2, line 15) are about two orders of magnitude higher than the energy densities used in the present invention. The energy levels described in U.S. Pat. No. 3,081,485 would cause ablation. The authors note on column 2, lines 26 ff. that small traces of irradiated material are evaporated during irradiation. Although the patent describes surface heating, the immediate depth of e-beam penetration (see column 3) appears to be greater than 150 microns. This form of energy would have equal effects on the bulk polymer and would not cause only surface modifications.

U.S. Pat. No. 4,631,155 describes the surface modification of polymers by subjecting the surface to at least one pulse of intense electromagnetic radiation. The surface polymer is disoriented during the relatively long exposure to radiation. Disorientation is indicative of any amorphous surface. Very thick amorphous layers appear to be formed as indicated by the chloroform test described in column 5, and it is very likely that treatment under the conditions described in this patent would cause surface chemical changes.

SUMMARY OF THE INVENTION

The present invention provides a process for heat sealing at least one amorphized surface layer on semicrystalline polymers to another surface. Some of the special properties in the preferred semicrystalline polymers used in this invention are reduced optical reflectance and increased optical transmission, increased coating adhesion, increased auto-adhesion, and a non-yellowed (non-degraded) surface. The preferred polymeric article used in the present invention comprises a semicrystalline polymer having on at least one surface thereof areas having a depth of at least 5 nm of the same polymer composition in a quasi-amorphous state. The areas may be continuous or discontinuous.

BRIEF DESCRIPTION OF THE DRAWING

The FIGURE shows a chart which indicates the relationship of bond strengths to the number of pulses/fluence of modifying radiation.

DETAILED DESCRIPTION OF THE DRAWING

The FIGURE graphically shows the effects of surface modification according to procedures for forming the article used in the practice of the present invention and shows effects of other known processes on properties on poly(ethylene terephthalate) film.

The diagonal line represents constant energy density. That is, the number of pulses multiplied by the energy per pulse remains constant along that line. The shaded area (1) shows microtexturing of the surface which occurs with ablation and etching techniques. This tends to produce high bond strengths. The crosshatched area (2) shows surface modification according to the present invention wherein the properties of the surface can be controlled between strong (greater than 2000 g/linear inch), medium (1000–2000 g/linear inch) and weak (0–1000 g/linear inch) bonds. These bond strengths are for autoadhesion of the surfaces.

DETAILED DESCRIPTION OF THE INVENTION

The present invention provides a process for heat sealing at least one film having at least one amorphized surface layer on a semicrystalline polymer. This surface is preferably formed by the irradiation of the polymer by radiation which is strongly absorbed by the polymer and of sufficient intensity and fluence to cause such amorphized layer. The semicrystalline polymer surface is thus altered into a new morphological state by radiation such as an intense short pulse UV excimer laser or short pulse duration, high intensity UV flashlamp.

The quasi-amorphous surface layer or areas produced according to the practice of the present invention are generally and preferably substantially, essentially, or even totally free of polymeric decomposition debris which typically results from ablative processes as described in U.S. Pat. No. 4,417,948 and the articles of Srinivasan et al. noted above.

The residual debris denoted above would be organic material having a lower oxygen/carbon ratio than the bulk polymer. Even if not visually observable in the amounts present, the debris itself would be yellower in color than the bulk material and would be more highly conjugated. The debris also tends to leave microscopically observable (at least 10,000, preferably 20,000X) artifacts on the surface recognizable as debris and not merely texturing. With respect to poly(ethylene terephthalate), ablation produces a surface substantially soluble in acetone, while the preferred quasi-amorphous surface is not in acetone.

The process of the present invention comprises 1) placing two surfaces in contact with one another, one of the surfaces comprising a semicrystalline polymer, the contacting surface of which has areas of the same polymer in a quasi-amorphous state, the areas having a depth of at least 5 nm, and 2) heating the areas of contact between said two surfaces sufficiently to cause bonding therebetween. The temperature used is, of course, dependent upon the polymers used, each polymer having different softening, melting, or fusing temperatures The temperature may be as low as 100° C. although minimum temperatures of 110° C. or 120° C. are more common. The limit on temperatures at the interface should be lower than those that would degrade the polymer (generally lower than 400° C.) or disrupt the semicrystalline structure or orientation (generally lower than 300° C.).

Pressure is of course desirable during the process to keep the surfaces intimately engaged during heat sealing. This may be accomplished by platens or rollers or the like. Pressure on the order of at least 5 $g/cm^2$ is desirable with pressures of at least 10 $g/cm^2$ or 50 $g/cm^2$ being more preferred.

In understanding the present invention, a number of terms and concepts should be appreciated. The treatment of the surface of semicrystalline polymeric materials according to the present invention does not add or substantially remove material from the surface. Residual solvent or residual low molecular weight reactants and additives may be volatilized during this treatment, but there is less than 0.1% or 1% degradation (to a volatile state) and/or volatilization of the bulk of polymeric material (within the amorphized layer or melted volume) having a molecular weight in excess of 10,000. The chemical modification of the polymer surface (e.g., oxidation, chain breakage) is minimal if there is any at all. Only a small amount of chain breakage occurs, without the generation of significant amounts (i e , greater than 1% or 0.1% by bulk weight) of materials volatilized during the process.

The terms amorphous, crystalline, semicrystalline, and orientation are commonly used in the description of polymeric materials. The true amorphous state is considered to be a randomly tangled mass of polymer chains. The X-ray diffraction pattern of an amorphous polymer is a diffuse halo indicative of no regularity of the polymer structure. Amorphous polymers show softening behavior at the glass transition temperature, but no true melt or first order transition.

The semicrystalline state of polymers is one in which long segments of the polymer chains appear in both amorphous and crystalline states or phases. THe crystalline phase comprises multiple lattices in which the polymer chain assumes a chain-folded conformation in which there is a highly ordered registry in adjacent folds of the various chemical moieties of which the chain is constructed. The packing arrangement (short order orientation) within the lattice is highly regular in both its chemical and geometric aspects. Semicrystalline polymers show characteristic melting points, above which the crystalline lattices become disordered and rapidly lose their identity. The X-ray diffraction pattern of semicrystalline polymers (or copolymers) generally is distinguished by either concentric rings or a symmetrical array of spots, which are indicative of the nature of the crystalline order.

Orientation of the polymer is the directional alignment of the polymer chain (long-range order) or segments of the polymer (chain) within the polymer composition. In the quasi-amorphous state described in the practice of the present invention, it appears that the overall long-range order orientation or ordering of the crystal lattice remains in an apparent crystalline orientation. It also appears that there is, however, significant localized disordering along the chain (short-range order orientation). The quasi-amorphous form thus exhibits short-range order non-orientation or low orientation typical of amorphous phases while it exhibits long-range ordering typical of crystalline structures. These characteristics are observable and determinable by single analytic techniques or combinations of techniques such as X-ray diffractions, spectromicrophotometry, IRRAS, NMR, solvent extraction, and the like.

The surface of the semicrystalline polymer is converted into its quasi-amorphous form by heating and rapid cooling of a determined amount of that surface. A determinable depth of the polymer composition is converted to the quasi-amorphous state. The conversion is referred to as "amorphizing." The thickness of the amorphized polymer, as measured from the surface downward into the bulk of the polymer, can be controlled. The polymer usually has a quasi-amorphous top surface having a depth of at least 5 nm, preferably at least 10 nm, more preferably at least 40 nm and most preferably at least 60 nm. The range of thickness for the quasi-amorphous phase or surface of the polymer may be from about 5 to 10,000 nm, preferably 10 to 1,000 nm, more preferably 20 to 500 nm or 20 to 100 nm and most preferably 20 to 250 nm, depending upon the ultimate use of the article.

The surface quasi-amorphous layer is firmly adhered to the bulk of the semicrystalline polymer because of the in situ nature of the conversion. There can even be a discernible gradation zone between the quasi-amorphous and semicrystalline areas, although this is not always the case. That is, the transition can be very abrupt within the polymer.

The portion of the surface area which is amorphized may be as small as 1% with some beneficial effects being noted. Generally it is at least 3%, and preferably 5 to 100% of the surface. More preferably at least 10% or 30 to 100% of the surface is quasi-amorphous. These are percentages by surface area.

In performing the process of making the quasi-amorphous surfaces of the present invention, the wavelength of the light or ultraviolet radiation and/or the polymer and/or absorbing dye in the polymer should be chosen so that the polymer composition exhibits an extinction coefficient greater than about 5,000. An absorption coefficient of 1/micrometer or preferably 5/micrometer is preferred. The higher the extinction coefficient for any given wavelength, the thinner is the surface layer which resides in the optical path of the radiation, and correspondingly, the thinner is the surface layer which undergoes a morphological transition or "amorphization". The wavelength range of preferred interest is between about 180 and 260 nm, with the highest extinction coefficient being manifested at the shorter wavelengths. Preferably a coefficient of extinction of at least 10,000 is exhibited by the polymer at the wavelength of irradiation.

When utilizing ultraviolet radiation (e.g., 193 nm), it is desired that the polyester film receives energy corresponding to a fluence of 3–25 mJ/cm$^2$/pulse. At fluences of less than 3 mJ/cm$^2$/pulse, the effect of the radiation is not readily discerned. At fluences greater than 25 mJ/cm$^2$/pulse, one begins to encounter excessive damage to the affected surface layer, such as vaporization (e.g., off-gassing) of low molecular weight products of photodegradation, substantial reduction of the molecular weight of the surface layer, and more extensive surface roughening.

The radiation pulse duration, i.e., the pulse width, should be in the range of 10 nanoseconds to 100 microseconds to assure rapid excitation of the affected surface layer.

The net effects of pulse width, coefficient of extinction, and radiation intensity are to produce a particular type of mechanistic events. First, and to a minor degree, there is a photolytic effect in which absorbed radiation energy causes random bond scission to occur in the semicrystalline polymer. This effect is desirably minimized in the practice of the present invention to minimize the damage to polymer properties caused by this effect. Indeed, operation of the present invention under ideal conditions has been found to cause some decrease in the oxygen-to-carbon ratio, but sensitive ellipsometric and infrared measurements have been unable to detect any significant loss of material as a result of proper radiation conditions.

The second effect is a result of the unusual nature of the thermal excitation of the surface layer in the optical path of the radiation. Much of the absorbed light energy is translated into heat, with the heating cycle corresponding to the pulse width of the radiation. It is certain that instantaneous temperatures that exceed the normal melting point of the polymer (e.g., for poly(ethylene terephthalate that is about 260° C.) are reached throughout most of the affected volume, although an unusual thermal gradient may be produced within that volume because of the rapid attenuation of the incident energy due to light extinction by the polymer composition. The heat cycle thus corresponds to the pulse width, in a range of from about 10 nanoseconds to 100 microseconds. After the heating cycle, the next phenomic concern is the ensuing cooling cycle. Because of the thin nature of the affected volume and its contact with ambient air at the surface and bulk material (which are usually at room temperature), it can be estimated that the surface probably cools down to the glass transition temperature (e.g., for poly(ethylene terephthalate) this is about 75° C.) within microseconds. Once below this temperature, polymer chain conformations tend to be frozen. Considerations with respect to this unusually brief thermal cycle indicate that conformational changes available to the polymer chains remain highly restricted during the brief period while the affected surface area undergoes this excitation. Short segmental motions, e.g., of the 'crankshaft' rotational type, have extremely short relaxation times, and it is expected that they may readily occur within the time-temperature regime created in the practice of the process of the present invention. The confirmation that such motions do indeed occur is provided by the IRRAS spectroscopic studies that show that there is a significant trans-to-gauche-conformer transformation in the surface layer which results from the irradiation of semicrystalline film (e.g., biaxially oriented poly(ethylene terephthalate)) with an ArF excimer laser.

This type of conformational change requires the rotation of a short segment of the PET chain involving only a few carbon or oxygen atoms. Similar considerations indicate that it is highly unlikely that the pre-existing crystallites or crystal lattices in the affected surface layer undergo any major spatial rearrangements because this time-temperature regime precludes the type of long range translational and large chain segment rotational motions which would materially change the pre-existing packing arrangement within the crystal lattice. Thus, it strongly appears that the pulsed UV irradiation of PET (and probably all semicrystalline polymers having appropriate extinction coefficients) provides films having surface layers with a unique morphology (i.e., quasi-amorphous) in which the polymer chains are highly disordered over short segment lengths, but substantially retain the long-range order that existed between chains and over long segment lengths of those chains prior to excitation. Indeed, the excimer laser treatment of a thin film of thermally crystallized PET indicated that the original spherulitic structure remained intact, tending to affirm this description.

The substantial trans-to-gauche-conformer transformation is a clear indication of short range chain conformation disordering, suggesting that although the crystallites may have undergone short range disordering, the longer range 3-dimensional packing order probably remains virtually intact. It is for this reason that the surface is referred to as quasi-amorphous since it has physical characteristics embodying some crystalline properties, and yet displays predominantly amorphous properties.

The volume of polymer affected or converted (i.e., the affected surface layer) by the process of the present invention is defined as being in a 'quasi-amorphous' state because the highly ordered registry of identical chemical moieties in adjacent folds of the chain-folded crystal lattice is largely destroyed, but the overall 3-dimensional architecture of the crystal lattice is preserved. Thus, the chemical disordering which occurs as a result of the radiation is characteristic of an amorphous state, while the retention of longer range geometric order resembles a pseudo-crystalline state. The layers or regions are neither totally amorphous nor totally crystalline in the classic sense of those words. In this specification where quasi-amorphous layers or regions produced in the practice of the present invention are discussed, those regions may be referred to as quasi-amorphous layers or regions because their chemical properties tend to resemble amorphous compositions rather than crystalline compositions, but amorphous and quasi-amorphous are distinctly different as noted in the description of quasi-amorphous materials given above.

Quasi-amorphous is a state which is between semicrystalline and amorphous. It is more difficult to distinguish from a true amorphous state than a semicrystalline state, but a clear distinction can be drawn.

The quasi-amorphous layer must, of course, be formed from a semicrystalline state. The semicrystalline state may be a uniaxially oriented film, biaxially oriented film, or contain grossly unoriented crystallites (e.g., spherulitic crystallites randomly distributed throughout the film). When such a semicrystalline film is converted by the process of this invention (in whole or in part, as on one surface only) to the quasi-amorphous form, the quasi-amorphous areas will appear to be amorphous except that they will retain a latent memory for the crystallite orientation. This is a definitive distinction from the true amorphous state.

For example, oriented film will display anisotropy with respect to the absorption of infrared radiation (e.g. between 5,000 and 16,000 nm) in various directions in the film. Biaxially oriented film would most significantly display this anisotropy between the unoriented thickness dimension (e.g., the Z-axis) and the oriented length and width dimensions (e.g., the X- and Y-axes) of the film. When such an oriented film is quasi-amorphized according to the present invention to a state most closely resembling a true amorphous film (e.g., the entire thickness or a larger thickness is repeatedly treated without ablation of the film is quasi-amorphous), the film or layer will appear to be amorphous. However, the film or layer will not be truly amorphous because it will retain a latent memory for the crystallite orientation, in this case being evidenced by a latent memory for the anisotropic orientation of the original semicrystalline polymer.

When this quasi-amorphous layer or film is heated to promote recrystallization, the film or layer will begin to regain its original crystallite distribution or in the case of oriented film, regain at least part of its anisotropic orientation. When a truly amorphous layer is reheated, it will not develop anisotropy. Where the semicrystalline polymer film originally contained grossly unoriented crystallites, reheating of the quasi-amorphous layer or film would return such a crystallite orientation to the layer or film.

The process appears to work by the semicrystalline polymer's absorbing the energy of the irradiation within a limited depth of the irradiated surface. The energy is of sufficient intensity and duration to melt polymer, but of insufficient intensitiy and duration to evaporate, significantly chemically modify, or ablate polymer. When the irradiation stops, the melted polymer rapidly cools without recrystallization. No special cooling of the melted layer usually needs to be performed as the melted layer is usually sufficiently thin that ambient air and adjacent bulk polymer temperatures will cool it sufficiently rapidly. Forced cooling can be used on thicker layers if desired or can be used on thin layers to insure even more rapid cooling.

The semicrystalline polymer should be able to absorb the irradiation used in the process. The more highly absorptive the polymer is of the radiation, the greater the concentration of the process to the surface of the polymer. In general, the polymer should be able to absorb sufficient energy to cause thermal softening or melting of the surface and yet not absorb radiation at such a high level as would cause ablation, excessive degradation, or volatilization of the polymer. For example, a polymer may absorb at least 5% of incident radiation in a 1 micron thick film when the radiation is applied at a rate of 1 Joule/cm$^2$. Absorption of the radiation may be enhanced by the addition of radiation absorbing dyes and pigments to the polymer. These, and other, radiation abosrbing materials can have some noticeable effect at levels as low as 0.05% by weight, but can also be used at higher levels, even up to 90% by weight and higher. For example, a polymer used to modify a pigment may be treated after it has been combined with the pigment. A generally preferred range would be from 0.1 to 50% by weight for such radiation absorbing additives.

The quasi-amorphous surface layer on the semicrystalline polymer base is unique because 1) it exists without substantial change of the surface chemical structure while the bulk properties of the polymer are unchanged, 2) it has a lower softening temperature than the semicrystalline polymer, which lower softening temperature allows auto adhesion at a temperature below that at which the bulk film would autoadhere, 3) it is more easily swelled by organic solvents which allows a high degree of bond entanglement with itself and with other coatings and polymers, 4) the controlled depth of amorphization serves to limit the depth of solvent penetration and hence limits the effect of solvents on the quasi-amorphous layer, and 5) it has a reduced optical index of refraction which is graded from the bulk to the surface.

The product used in the practice of the present invention has characteristics and features which tend to be different from those of the products of prior art processes. For example, it has been noted that the depth of the quasi-amorphous areas is at least five (5) nanometers. This tends to be an inherent result of the process. The previously referenced work reported by Wu concerning truly amorphous surfaces generated by noncrystallizable fractions being forced to the surface produces very thin amorphous layers. The thickness of these layers is never more than 3 nm and is usually less than 2 nm. Additionally, the chemical make-up of the surface region is significantly different from that of the bulk polymer because of the concentration of non-crystallizable fractions at the surface. The surface produced by this prior art phenomenon would have a weight average molecular weight more than 50% different from the weight average molecular weight of the associated bulk semicrystalline polymer. The surface produced by the practice of the present invention would have a difference of less than 50% between the weight average molecular weight of the surface quasi-amorphous layer and the bulk semicrystalline polymer.

Another characteristic of the treated materials used in the present invention which sometimes can be observed but is unique to those articles of the present invention is the similarity between the molecular orientation of the surface quasi-amorphous layer and the semicrystalline polymer in bulk. Polymer orientation relates to the degree to which polymer chains are statistically or more predominantly oriented within the polymer. Ordinarily, when semicrystalline polymers are melted, the orientation in the amorphous and crystalline phase is randomized and is significantly different from the orientation of semicrystalline polymer. Observations of the amorphized surfaces in the practice of the present invention indicate that the orientation within the quasi-amorphous layer remains similar to that of the semicrystalline polymer. Microscopic examination under crosspolarizers shows that the orientation of the quasi-amorphous layer is similar to or indistinguishable by visual observation from the orientation of the semicrystalline polymer. The physical properties of the quasi-amorphous layer, such as its index of refraction, infrared absorption spectrum and solubility clearly show that the layer is in fact in an amorphous-like state.

Corona discharge treatment of polymer surfaces does not necessarily render surfaces amorphous, but oxidizes the surface of the polymer. Corona treatment tends to have its most significant oxidative effect to a depth of about 2 nm. The corona treatment creates or adds functional groups to the polymer as a result of reactions with the environment in which the discharging is performed. For example, functional groups such as carboxylic groups, phenol groups, hydroxyl groups, carboxyl groups, and amide groups can be added to the polymer by the corona treatment. These groups would not be a direct product of the process of the present invention. Corona treatment of the amorphous surfaces of the present invention would generate such functional groups and would not necessarily crystallize the surface. Corona treatment also changes the optical density of the surface layer because of the formation of these new chemical materials in that surface. As compared to the bulk polymer, the optical density of the surface layer may increase by 0.2 within a 50 nm region of the visible portion of the electromagnetic spectrum (particularly in the yellow region).

Both corona discharge and flame treatment significantly modify the chemical composition of the polymer in the surface regions treated. Corona discharge tends to crosslink or degrade the polymer, creating a higher or lower crosslink density in the surface than in the bulk polymer. The article of the present invention, unless further treated as by corona discharge, will have approximately the same crosslink density in the amorphous surface layer as in the bulk polymer region. This change in crosslink density can be observed in the surface layer by a reduced tendency or ability to recrystallize. Plasma, and ion implantation treatments have effects on the crosslink density similar to those generated by corona discharge.

Flame treatment of polymeric surfaces (such as that reported in U.S. Pat. No. 4,568,632) is a much more destructive and chemical composition altering process than the process of the present invention. The patent describes the ablation of materials from the surface during treatment. This is probably the combined result of evaporation, oxidation, polymer chain breakage, and other destructive processes. This process would cause the formation of the functional groups described above and probably cause a significant overall change in the molecular weight and chemical make-up of the polymer on the surface, probably to a depth of about 2 nm. The flame treatment as presently practiced also causes a change in the optical density of the polymer on the surface due to the change in the chemical composition of that surface layer. That change in optical density is at least about 0.2. In the practice of the present invention, the quasi-amorphous layer produced on the surface has an optical density which is within 0.1, preferably within 0.08, more preferably within 0.05 and most preferably within 0.03 units of the bulk polymer. Additional treatment (e.g., corona discharge or coloration with dyes or pigments) could, of course, be used to change that value. But in the absence of dyes or pigments differentially distributed between the amorphous layer and the bulk layer, there should be little or no difference in optical densities.

In the preferred fluence range of the present invention, the most notable result is the formation of a new morphological state of the polymer within the surface layer (i.e., a quasi-amorphous, deoriented or oriented glass) which resides in the optical path of the radiation and begins at the surface of the polymer. This morphological transition is attended by some extremely mild degradation, as attested by the diminution of the O/C ratio (XPS analysis and solvent extraction data). The failure to detect weight loss by infrared and ellipsometric measurements indicates that gas evolution is, at most, a minor event. Similarly, IRRAS spectra shows evidence of only a morphological rather than any chemical change. The change in the O/C ratio is quite different from that occurring with flame treatment or corona discharge where the atom/atom, oxygen/carbon ratio increases. This increase may be very small, but in most thorough treatments there is a change in the ratio of about 0.1 or 0.2. The O/C ratio may actually decrease in the quasi-amorphous layer as compared to the bulk polymer.

The remarkable aspects of the preferred surface layer produced in this invention are: 1) its unchanged texture; 2) its unchanged optical absorption or scattering characteristics, and 3) its still appreciable molecular weight. Each of these aspects can be very important. For example, film roughness is very injurious in substrates for magnetic media because that roughness can be the limiting factor in the ultimate density of recorded information that can be achieved. Film yellowing or scattering (i.e., haze) on the other hand cannot be tolerated where the film is used as a substrate in the manufacture of imaging products, e.g., X-ray film. Finally, the absence of a major fraction of low molecular weight oligomeric products avoids the situation where subsequently applied functional coatings fail in use due to inherently poor adhesion or solvent resistance which stems from the weak boundary layer present at the coating/film interface.

The quasi-amorphous surface of the polymer also reduces the reflectivity of that surface. Normal, smooth uncoated polymer films will have a reflectivity of 10% or more. Highly texturized polymer surfaces can reduce this reflectivity, but cannot present a smooth surface, that is a surface having no texture which is easily visible with a scanning electron microscope at 10,000x magnification. The polymer films of the present invention can provide smooth surfaces with reflectivities of 9% or less to 550 nm light at 80°-90° incident angles. This is clearly shown in the Examples.

The process of the present invention also tends to not modify the surface of the polymer in a topographic morphologic sense. The surface structure, before and after amorphizing, tends to be the same in the practice of the present invention. Surfaces with a high degree of surface roughness may be somewhat softened in their features, but will still tend to have rough surfaces. Smooth surfaces will be substantially unchanged with respect to the absence of features on their surface. Flame treatment would tend to greatly modify the surface features of the surface so treated.

The process of producing this invention is an advance over prior methods of surface modification such as sputter etch, plasma, corona, chemical, flame and solvents because no vacuum is required, no contact with the surface is required, no chemistry is added to the treated polymer so that it is more likely to be recyclable, and there are no known environmental problems.

The surface properties of polymer films are of considerable importance to industry. These properties include adhesion, coefficient of friction, optical properties, wettability, and barrier properties. Modification of polymer surfaces to obtain these desired properties already can be realized by a number of different techniques. Many of these prior art processes can have adverse effects on the product, however. The more traditional "wet chemical" modification techniques, such as treatment with acids, amines, caustic, phenols or non-reactive liquids (i.e., solvents), have been successfully used to enhance the "wettability" and "bondability" of films and fibers. These chemical treatments can cause a temporary swelling of the polymer surface which results in a more reactive surface and on chemical evaporation this swelling subsides. These treatments can also result in a chemical modification of the surface by adding new substances, breaking the surface down to new substances, which also results in lower molecular weight polymer chains on the surface, or by cross-linking molecules on the surface.

With the increasing concern over environmental and safety issues, industry has looked toward a number of non-chemical surface modification techniques. Alternative techniques such as treatment with corona, plasma, sputter etch, E-beam, heat, UV, and lasers have been used to modify polymer surface properties. All of these treatments affect polymer surfaces in a fairly gross manner. With the exception of E-beam and heat, they all result in a roughened surface caused by removing material, and they all result in chemical modifications to the surface which are much like the changes from wet chemical treatments. None of these treatments affects the crystallinity of the polymer significantly without creating new surface chemistry. Table 1 is a summary of how various treatments affect polymer surfaces.

TABLE 1

TREATMENT OF POLYMER SURFACES

| Treatment | Surface Texture | Surface Effect | Purpose of Treatment |
|---|---|---|---|
| Corona | Rough to Smooth | Remove Material Add Material Bond Scission | Priming Enhance Wettability Improve Adhesion |
| Plasma | Rough to Smooth 100-2000Å | Remove Material Add Material Crosslinking | Priming Enhance Wettability Improve Adhesion |
| Sputter-Etch | Rogh 100-2000Å | Ablation Change Chemistry | Enhance Wettability Improve Adhesion Reduce Coefficient of Friction Reduce Optical Reflectance |
| High Intensity E-Beam | No change | Chain Scission Cross Linking Bulk Treatment Thick Layer High Energy | Curing Surface Coats Grafting Coating Adhesion |
| Heat (Flame) | No change | Chain Scission Change Chemistry Oxidation Thick Layer | Enhance Printability Form Barrier Layer |
| High Intensity UV | Rough to Smooth | Ablation Change Chemistry | Priming Enhance Wettability Improve Adhesion Etching |
| Laser (prior art) | Rough to Smooth | Ablation Change Chemistry | Etching Priming Enhance Wettability Improve Adhesion |
| Laser (Present Invention) | No change | Amorphize Thin Layer Photolyze | Reduce Optical Reflectance Increase Optical Transmission Improve Adhesion Improve Auto-Adhesion Reduce Coefficent of Friction |

TABLE 1-continued

| | TREATMENT OF POLYMER SURFACES | | |
|---|---|---|---|
| Treatment | Surface Texture | Surface Effect | Purpose of Treatment |
| | | | Enhance e-Beam Grafting Barrier Layer Inc. Solubility of Crystalline Mtl. Grafting |

Polymers generally can be either semicrystalline or amorphous. These categories are descriptions of the degree of ordering of the polymer molecules. Amorphous polymers consist of randomly ordered molecules. That is, the polymers are of low order or non-ordered and are independently surrounding and intertwined with other molecules. Semicrystalline polymers consist of a mixture of amorphous regions and crystalline regions. The crystalline regions are said to be more ordered and the molecules actually pack in some crystalline-like structures. Some crystalline regions may be more ordered than others. If crystalline regions are heated above the melting temperature of the polymer, the molecules become less ordered or more random. If cooled rapidly, this less ordered feature is "frozen" in place and the resulting polymer is said to be amorphous. If cooled slowly, these molecules can repack to form crystalline regions and the polymer is said to be semicrystalline. Some polymers are always amorphous. Some polymers can be made semicrystalline by heat treatments, stretching or orienting and by solvent inducement, and the degree of crystallinity can be controlled by these processes.

One aspect of the uniqueness of the present invention is the reversal of the above crystallization process to transform a thin surface layer of semicrystalline polymer into a quasi-amorphous thin surface layer residing on nonaffected bulk semicrystalline polymer.

There are two necessary conditions required of the radiation source to provide the treatment of the present invention. Both high intensity (high power per unit area) and high fluence (high energy density per pulse) are required of the radiation source. These requirements assure that a substantial amount of heat generated in the very thin surface of treatment stays in the surface. The effect of the radiation is to concentrate energy into the surface layer. Thermal diffusion into the bulk reduces this concentration of energy and makes the process less efficient. It is, therefore, desirable that only a small amount of heat be dissipated into the bulk of the polymer during irradiation. The more heat that is transferred to the bulk during the surface irradiation, the less efficient the process becomes until so much heat goes to the bulk that the process no longer works. Because of this requirement to rapidly heat only the surface layer and not the bulk of the polymer, conventional high intensity UV sources such as mercury arc lamps and common Xenon flash lamps with their inherently long pulse widths result in rapid diffusion of the thermal energy into the bulk polymer. This prevents a high concentration of energy being achieved at the surface.

The UV excimer laser is capable of producing high intensity, high fluence radiation on the surface of the polymer to be treated. The polymer used with a UV excimer laser must be semicrystalline and UV absorbing at the UV laser wavelengths. The result of the laser pulse interacting with the surface is a combination of photolyzation and heating. In other words, the short intense pulse significantly heats the surface of the polymer, but not the bulk, above the polymer melting temperature, and some surface molecule chain scission occurs. During the brief time the surface region is heated above its melting temperature, the molecules can randomize themselves into a disordered condition and broken bonds reconnect, although not necessarily to the same end from which they were broken or to the same degree. The temporarily broken molecular bonds will assist this melting process. After irradiation the surface layer will rapidly cool, and "freeze" the new disordered layer into an amorphous structure. That is, the cooling rate is fast enough so the surface layer cannot recrystallize. The irradiation thus produces an amorphous layer on the bulk polymer which layer undergoes only a small change in molecular weight because of the recombination of bond scissions and no chemical changes such as the addition of ions. The surface texture undergoes no significant change because no material has been removed or ablated and both melting and cooling occur over a short period of time.

The laser treated surface can be shown to be quasi-amorphous by a number of tests: 1) it washes off with solvents that only the amorphous form of the polymer is soluble in, 2) infrared reflection absorption spectroscopy (IRRAS) of the surface indicates the same pattern in the surface layer as is normally exhibited by the amorphous form of the polymer, and 3) thin film ellipsometry of the surface gives the same refractive index as does the amorphous form of the polymer.

XPS measurements of the treated surface indicates no significant chemical changes by addition. It also shows that a small O/C ratio change has occurred which indicates some small amount of surface decarboxylation. Gel permeation chromotography (GPC) shows only a small molecular weight decrease as compared to the untreated polymer. Water contact angle measurements show no change in the treated surface which means the surface has not been roughened significantly and that functionality groups have not been added. There is a slight texturing on an extremely fine scale. Shadow mask Transmission Electron Microscopy (TEM) indicates peaks and valleys on the surface of about 300 Å. This may account for the improved slip properties of the treated surfaces of this invention.

Early investigations of laser treatments of polymers were concerned with etching or ablation of the polymer and thus used laser intensites and fluences much higher than required for the present invention. These investigators found a fluence threshold for ablation which of course was different for each polymer treated. Below this threshold no ablation would take place. Investigation was never made to determine what actually was occuring at lower fluences. It has been found that like the fluence threshold for ablation, there is likewise a fluence threshold for the amorphization of this invention and it too varies with the polymer being treated.

Because of its great commercial interest, the treatment of PET has been studied most extensively during the progress of the present invention. However, other polymers have also been studied. The following semicrystalline, UV absorbing polymers or copolymers thereof have been treated: polyesters (e.g., PET), nylon, urethanes, coating mixtures of poly(vinylidene chloride) on PET and poly(vinyl chloride) with UV absorbing plasticizer added. Polypropylene, polyethylene (e.g., polyolefins), polyvinyl chloride, polytetrafluoroethylene and polyvinylidene chloride, although semicrystalline, are not UV absorbing at wavelengths greater than 190 nm, and therefore, require one of the following: the addition of UV absorbing compounds, shorter wavelength lasers, or an energy source different than a UV laser. E-beam, x-rays, ion beams, and plasmas, if applied in sufficient intensity and fluence can work on these polymers.

Polymethylmethacrylate and epoxies are already amorphous and so treatment is unnecessary and does not effect a differentiation between the surface and bulk polymer.

The UV radiation source can be by excimer laser or flashlamps at wavelengths less than 320 nm. The pulse widths should be less than 100 microseconds. Typical pulse widths are 7.5 microseconds for flash lamps and 10–80 nanoseconds for an excimer laser.

EXAMPLES

In the following examples all treatments were done using either a Model 2460 laser by Questek, Billerica, Mass. or a Model 102E laser by Lambda Physik of Acton, Mass. These lasers give equivalent outputs for the purposes of treating polymer films. The lasers were operated with either Ar plus Fluorine gas at an emission wavelength of 193 nm or with Krypton plus Fluorine gas at an emission wavelength of 248 nm and with a system of cylinderical lenses to control the exposed area of the sample and thus the energy density of the beam striking the sample. Each system was calibrated using a Model ED500 power meter by Gentech, Ste-Fog, Qc, Canada. Pulse width was approximately 15 nanoseconds for both lasers.

EXAMPLE 1

This example describes the treatment of a surface of 0.1 mm (4 mil) thick biaxially oriented polyethyleneterephthalate (PET) film with no slip agents added. This film is available as product #OR8478400 obtainable from 3M, St. Paul, Minn. After laser exposure each sample was measured for change in optical transmission at 550 nm using a Lambda 9 Spectrophotometer from Perkin Elmer (Norwalk, Conn.) with a 10 second response time. Untreated film was used as a control and measured 88.25% optical transmission. The following data shows the change in % transmission from this control value.

Table 2 shows the results and indicates an increase in optical transmission for PET films treated on one side at 193 nm and an apparent leveling off of the effect with increased fluence. This increasing and then leveling off is due to the depth of treatment increasing with increasing fluence. Also quite noticeable is the threshold effect wherein about 3 mJ/cm$^2$/pulse fluence is required for the onset of this increased transmission. This fluence threshold is noticed on all effects measured for this laser treatment.

TABLE 2

| Sample | Exposure (MJ/cm$^2$) | % Change in Transmission (at 550 nm) |
|---|---|---|
| A | 1 | 0 |
| B | 2 | 0 |
| C | 3 | .03 |
| D | 3 | .08 |
| E | 3 | .10 |
| F | 4 | .18 |
| G | 4 | .37 |
| H | 4 | .45 |
| I | 5 | .58 |
| J | 5 | .78 |
| K | 5 | .82 |
| L | 6 | 1.1 |
| M | 7 | 1.4 |
| N | 8 | 1.28 |
| O | 9 | 1.40 |
| P | 9 | 1.44 |
| Q | 10 | 1.38 |

Laser treatment of polymer films does not significantly change the absorptivity of the film at wavelengths greater than 350 nm. Therefore, increased transmission of laser treated films is a result of reduced reflectivity of the film and measurement of either effect is equivalent.

EXAMPLE 2

The example is a repeat of Example 1 with the exception that the laser gas was a mixture of Kr and F and the output wavelength was 248 nm.

The data indicated that there was no change in the optical transmission until fluence exceeded 5 mJ/cm$^2$ There was an increase of transmission to a peak change of 1.5%, reached at 9 mJ/cm$^2$. The shift of the fluence threshold to a higher value of about 5 mJ/cm$^2$/pulse (as compared to Example 1) which indicates a threshold dependence on the wavelength of the radiation used to treat the surface. This occurs because PET more efficiently absorbs 193 nm wavelength radiation than it does 248 nm wavelength radiation.

Excimer lasers operate efficiently at four different wavelengths: 193, 248, 308, and 351 nm. Efficient modification of the polymer requires that most of the UV radiation be absorbed in the first few tenths of a micrometer of of the surface. PET intensely absorbs both 193 and 248 nm. The efficiency of the surface modification also depends on the photolytic activity of the UV. Since 193 nm is more strongly absorbed than 248 nm and has higher photolytic activity, 193 nm radiation is slightly more efficient for surface modification. The threshold for surface modification of PET by excimer laser radiation (15 nanosecond pulse width) is 3 to 4 mJ/cm$^2$/pulse for 193 nm and 5 mJ/cm$^2$/pulse for 248 nm.

Excimer lasers produce roughly twice as much power at 248 nm than 193 nm. Since the threshold for surface modification at 248 nm is almost twice that of 193 nm, the net efficiency of surface modification between the two wavelengths is nearly equal. Therefore, the choice of the operating wavelength can be based on other factors.

The heat sealing process of the present invention can be best effected by heating the surface layer (the quasi-amorphous layer) during or immediately before contact with the surface to be bonded. This softens the layer, particularly when heated above Tg or the normal melting point. Upon cooling, the surface layer crystallizes and becomes indistinguishable from the bulk polymer, but is adhered to the other surface.

EXAMPLE 3

Samples of 0.1 mm (4 mil) PET as in Example 1 were treated with one 7.5 microsecond pulse from an L-2695 flashlamp by ILC Technology, Sunnyvale, Calif., with a peak current of 1700 amperes, 25 Joules of stored energy and a lamp to sample distance of 1.0 cm. Optical transmission measurements were made on the treated sample with a Lambda 9 Spectrophotometer and showed an increase in transmission over the measurement range of 340 nm to 700 nm and at 550 nm there was a 1.5% increase. This indicates intense short pulse UV rich flashlamps are also capable of forming amorphous surface on polymers.

EXAMPLE 4

Samples of crystalline polyetheretherketone were treated as in Example 1 at various fluences. Optical reflectivity of the treated samples was measured at 550 nm with a spectrophotometer as in Example 1. The data indicated a reduced reflectivity with increased fluence from 16 to 24 $mJ/cm^2$/pulse, from 14.74% reflectivity to 14.60% reflectivity.

EXAMPLE 5

Samples of PET were treated as in Example 2 at fluences from 1 to 6 $mJ/cm^2$/pulse and measured for auto adhesion properties. A model 12ASD heat sealer by Sentinal of Hyannis, Mass. at 350° F., 20 psi sealing pressure and a 3 second dwell time was used to seal the treated surfaces to each other. Bond strength was measured by peeling the samples 180° apart by hand and judging the relative peel strength resulting from various fluences The data showed increased adhesion above a fluence of 4 $mJ/cm^2$/pulse. The film had slight adhesion without treatment, and increased to good adhesion at about 6 $mJ/cm^2$/pulse.

These data are very similar to those for % increase in transmission of Example 2 and shows substantially the same fluence threshold. This strongly implies that the amorphous surface created by this invention causes both effects

EXAMPLE 6

Samples of PET were treated as in Example 1 and measured for autoadhesion properties. A model 12ASD heat sealer by Sentinal of Hyannis, Mass. at 350° F., 20 psi sealing pressure and a 3 second dwell time was used to seal the treated surfaces to each other. Bond strength was measured by peeling the samples 180° apart by hand and judging the relative peel strength resulting from the various treatments. Since moisture is known to affect the bond strength of PET treated by other methods, each sample was tested both dry and under running water. Bond strengths were classified as follows: A weak bond was peelable without polymer film failure, a medium bond had a higher peel strength and occasional polymer film failure and a strong bond is not peelable and resulted in polymer film failure. These semiquantitative results are plotted in the FIGURE.

It is well known in the literature of continuous wave, low to moderate intensity UV lamps, that surface modification of polymers is energy density insensitive. That is, if for example, 100 $mJ/cm^2$ is required to modify a polymer in a certain manner, it doesn't matter if that energy density is obtained by using an intensity of 100 watts/$cm^2$ for 1 second or 50 watts/$cm^2$ for 2 seconds and it has always been assumed that this was inviolate up to the energy region required for photoablation. The line indicating constant energy density of the FIGURE illustrates this conventional wisdom and is substantiated by experiments up to a certain fluence.

The surprising discovery of this invention is that at a certain threshold fluence, in this case 3.5 $mJ/cm^2$/pulse, there is an enormous decrease in energy density required to produce auto adhesion. The explanation of this phenomenon is believed to be that at low fluences, auto adhesion is the result of oxidation of the surface layer, whereas above the threshold fluence an amorphous surface layer is created with a lower softening temperature than the bulk polymer which results in the increased auto adhesion. It can be seen that in the region of ablation or microtexturing, the auto adhesion for this polymer is also very strong. This is another surprising discovery of this invention and is due to a reduced softening temperature of structures generated on the polymer surface.

From the FIGURE, it is apparent that amorphization can be achieved with one pulse if the fluence level is within certain ranges, and increasing the number of pulses at a particular fluence increases the depth of treatment until at too high a pulse count the polymer starts to photo degrade significantly.

EXAMPLE 7

Samples of PET as in Example 1 were treated with various exposure to a CW short wave UV from a 6 watt model ENF-26 Spectronics lamp of Westbury, N.Y. The lamp was placed directly on the polymer surface for 1 minute, 15 minute, and 35 minutes. The exposed samples and an unexposed control were then sealed to themselves using a Model 12ASD heat sealer from Sentinal of Hyannis, Mass. set at 350° F., 20 psi sealing pressure for 3 seconds. Auto adhesion bond strength was measured by peeling the sealed samples 180° apart by hand and judging the resulting relative peel strength. Samples were also tested under running water for moisture bond strength. The results are shown in Table 3.

TABLE 3

| Exposure | Adhesion | Moisture Sensitivity |
|---|---|---|
| 0 min | no adhesion | NA |
| 1 min | no adhesion | NA |
| 15 min | moderate adhesion | yes |
| 35 min | moderate adhesion | yes |

Auto adhesion of PET from CW UV lamps is caused by surface oxidation and as can be seen gives a very different bond than PET laser treated as in Example 6.

EXAMPLE 8

A sample of PET was treated with short pulse UV flashlamps as in Example 3. A hand sealing iron at 145° C. was used to bond two samples to each other for six seconds. The samples showed good adhesion by attempting to peel the sample apart with a 180° hand pull. The bond was similarly tested under running water and was found to be moisture insensitive.

EXAMPLE 9

Samples of 0.038 mm (1.5 mil.) Nylon 66 from Allied Corp., Morristown, N.J., Product ID Capran-996 was exposed to one pulse of 25 $mJ/cm^2$ as in Example 1. The samples were bonded to each other using a fiberglass covered hand sealing iron at 143° C. for 6 seconds. Untreated control samples showed no auto adhesion while the exposed samples showed good adhesion by attempting to peel them apart with a 180° hand pull. The samples were boiled in water for 15 minutes and there was little to no perceptible decrease in bond strength.

EXAMPLE 10

Samples of PET were treated at two pulses at 5 mJ/cm²/pulse as in Example 1. These PET samples were bonded to the treated Nylon 66 samples of Example 9 using the same sealing conditions as Example 9. Peel tests using a 180° hand pull indicated good adhesion between the samples.

EXAMPLE 11

Samples of a coated PET film were treated as in Example 1. The coating was 0.002 mm (0.08 mil) of a solution of a copolymer of 75% polyvinylidene dichloride (PVDC) and 25% acrylonitrile and was coated on 0.0127mm (0.5 mil) PET. This film product is available as Scotchpar 86096 from 3M, St. Paul, Minn. At about 130° C. the coated side of this film is normally autoadhesive. This example shows the reduced temperature required to produce autoadhesion by first treating it with a UV laser. The samples were sealed to themselves at 110° C., 20 psi and 3 seconds dwell time using a model 12ASD Sentinal heat seater from Hyannis, Mass. The bonds were tested using a 180° hand pull and the results are shown in Table 4.

TABLE 4

| Sample | Fluence | # Pulses | Bonding Results |
|---|---|---|---|
| A | 3.0 | 5 | slight |
| B | 3.5 | 5 | tack |
| C | 4.1 | 5 | excellent-film failure |
| D | 4.7 | 5 | excellent-film failure |
| E | 5.5 | 5 | excellent-film failure |
| F | 7.8 | 5 | excellent-film failure |
| G | 10.4 | 5 | excellent-film failure |
| H Control | 0 | 0 | easily peeled |

As can be seen, above the fluence threshold of about 4 mJ/cm²/pulse, the bond strength was excellent and the peel test caused the film to fail. This example also shows that the of a U.V. absorber allows amorphatization of a normally non-UV absorbing crystalline polymer (PVDC).

What is claimed is:

1. A process for heat sealing two articles together, said process comprising providing at least one polymeric article comprising a semicrystalline polymer having on at least one surface thereof areas having thicknesses of at least 5 nm of the same polymer in a quasi-amorphous state, and then heating said at least one surface of said polymeric article while it is in contact with another article.

2. The process of claim 1 wherein at least 1% of said at least one surface is quasi-amorphous and the atom/atom, oxygen/carbon ratio of the quasi-amorphous areas is the same or greater than that ratio in the semicrystalline polymer.

3. The process of claim 1 wherein said areas have a depth of at least 10 nm and comprise from 50 to 100% of said at least one surface.

4. The process of claim 1 wherein said at least one polymeric article is in the form of a layer, sheet, film or coating.

5. The process of claim 1 wherein said areas comprise 30 to 100 percent of said at least one surface and the atom/atom, oxygen/carbon ratio of the quasi-amorphous areas is the same or greater than that ratio in the semicrystalline polymer.

6. The process of claim 4 wherein said areas comprise 50 to 100 percent of said at least one surface.

7. The process of claim 1 wherein the pressure is applied between said at least one polymeric article and said another article during heating.

8. The process of claim 6 wherein the quasi-amorphous area has a thickness of at least 5 nm and the atom/atom, oxygen/carbon ratio of the quasi-amorphous areas is the same or greater than that ratio in the semicrystalline polymer.

9. The process of claim 1 wherein the quasi-amorphous area has a thickness of at least 10 nm.

10. The process of claim 7 wherein the quasi-amorphous area has a thickness of between 20 and 100 nm.

11. The process of claim 7 wherein the quasi-amorphous area has a thickness of between 20 and 250 nm and said another article also comprises a polymeric article comprising a semicrystalline polymer having on at least one surface thereof areas having thicknesses of at least 5 nm of the same polymer in a quasi-amorphous state.

12. The process of claim 8 wherein the quasi-amorphous area has a thickness of between 20 and 250 nm and said another article also comprises a polymeric article comprising a semicrystalline polymer having on at least one surface thereof areas having thicknesses of at least 5 nm of the same polymer in a quasi-amorphous state.

13. The process of claim 4 wherein the quasi-amorphous area has a thickness of between 20 and 250 nm and said another article also comprises a polymeric article comprising a semicrystalline polymer having on at least one surface thereof areas having thicknesses of at least 5 nm of the same polymer in a quasi-amorphous state.

14. The process of claim 7 wherein said quasi-amorphous area has a thickness in the range of 5 to 10,000 nm and the atom/atom, oxygen/carbon ratio of the quasi-amorphous areas is the same or greater than that ratio in the semicrystalline polymer.

15. The process of claim 7 wherein said quasi-amorphous area has a thickness in the range of 20 to 500 nm and has an optical density, in the absence of dyes or pigments, which differ from that of the semicrystalline polymer by less than 0.1 in the visible region of the electromagnetic spectrum.

16. The process of claim 7 wherein said quasi-amorphous area has a thickness in the range of 20 to 250 nm and has an optical density, in the absence of dyes or pigments, which differ from that of the semicrystalline polymer by less than 0.1 in the visible region of the electromagnetic spectrum and the atom/atom, oxygen/carbon ratio of the quasi-amorphous areas is the same or greater than that ratio in the semicrystalline polymer.

17. The process of claim 7 wherein said semicrystalline polymer contains at least 0.05% by weight of a radiation absorbing dye or pigment.

18. The process of claim 7 wherein said semicrystalline polymer contains at least 0.05% by weight of a radiation absorbing dye or pigment and the atom/atom, oxygen/carbon ratio of the quasi-amorphous areas is the same or greater than that ratio in the semicrystalline polymer.

19. The process of claim 1 wherein said semicrystalline polymer comprises a polymer selected from the group consisting of poly(vinyl chloride), poly(vinylidene chloride), polytetrafluoroethylene, nylon, polyurethane, polyester, polyolefin, and copolymers thereof.

20. The process of claim 7 wherein said semicrystalline polymer comprises a polymer selected from the group consisting of poly(vinyl chloride), poly(vinylidene chloride), polytetrafluoroethylene, nylon, polyurethane, polyester, polyolefin, and copolymers thereof.

21. A process for heat sealing two articles together, said process comprising providing at least one polymeric article comprising a semicrystalline polymer having on at least one surface thereof areas having thicknesses of at least 5 nm of the same polymer in a quasi-amorphous state, and then heating said at least one surface of said polymeric article while it is in contact with another article, wherein said heating is to a temperature above Tg for the polymer and said areas crystallize upon cooling.

22. A process for heat sealing two articles together, said process comprising providing at least one polymeric article comprising a semicrystalline polymer having a crystallite orientation said article having on at least one surface thereof areas having thicknesses of at least 5 nm of the same polymer in a quasi-amorphous state wherein heating of said quasi-amorphous areas returns them to the same crystallite orientation of the semicrystalline polymer, and then heating said at least one surface of said polymeric article while it is in contact with another article to seal said two articles.

23. The process of claim 22 wherein at least 1% of said at least one surface is quasi-amorphous and the atom/atom, oxygen/carbon ratio of the quasi-amorphous areas is the same or greater than that ratio in the semicrystalline polymer.

24. The process of claim 22 wherein said at least one polymeric article is in the form of a layer, sheet, film or coating and said heating provides said areas with the same crystallite orientation as said semicrystalline polymer.

25. The process of claim 23 wherein said at least one polymeric article is in the form of a layer, sheet, film or coating.

26. The process of claim 22 wherein said quasi-amorphous area has a thickness in the range of 20 to 500 nm and has an optical density, in the absence of dyes or pigments, which differ from that of the semicrystalline polymer by less than 0.1 in the visible region of the electromagnetic spectrum.

27. The process of claim 23 wherein said quasi-amorphous area has a thickness in the range of 20 to 500 nm and has an optical density, in the absence of dyes or pigments, which differ from that of the semicrystalline polymer by less than 0.1 in the visible region of the electromagnetic spectrum.

28. The process of claim 24 wherein said quasi-amorphous area has a thickness in the range of 20 to 500 nm and has an optical density, in the absence of dyes or pigments, which differ from that of the semicrystalline polymer by less than 0.1 in the visible region of the electromagnetic spectrum.

29. The process of claim 25 wherein said quasi-amorphous area has a thickness in the range of 20 to 500 nm and has an optical density, in the absence of dyes or pigments, which differ from that of the semicrystalline polymer by less than 0.1 in the visible region of the electromagnetic spectrum.

30. The process of claim 24 wherein the crystallite orientation of said semicrystalline polymer is biaxial orientation.

31. The process of claim 28 wherein the crystallite orientation of said semicrystalline polymer is biaxial orientation.

* * * * *

UNITED STATES PATENT AND TRADEMARK OFFICE
CERTIFICATE OF CORRECTION

PATENT NO.  :  5,032,209
DATED       :  July 16, 1991
INVENTOR(S) :  Madeline P. Shinbach, Robert W. Warner,
               Andrew J. Ouderkirk and Douglas S. Dunn It is certified that error appears in the above-identified patent and that said Letters Patent is hereby corrected as shown below:

Column 6, line 31, delete "THe" and insert --The--.

Column 18, line 47, delete "of".

Column 20, line 36, "15 minute" should read --15 minutes--.

Column 21, line 47, after "absorber" insert
insert --(acrylonitrile)--.

Signed and Sealed this

Twenty-sixth Day of October, 1993

Attest:

BRUCE LEHMAN

Attesting Officer         Commissioner of Patents and Trademarks